United States Patent
Chin et al.

(10) Patent No.: US 8,791,444 B2
(45) Date of Patent: Jul. 29, 2014

(54) RESISTIVE RANDOM ACCESS MEMORY (RRAM) USING STACKED DIELECTRICS AND METHOD FOR MANUFACTURING THE SAME

(75) Inventors: Albert Chin, Hsinchu (TW); Chun-Hu Cheng, Hsinchu (TW)

(73) Assignee: National Chiao Tung University, Hsinchu (TW)

(*) Notice: Subject to any disclaimer, the term of this patent is extended or adjusted under 35 U.S.C. 154(b) by 1 day.

(21) Appl. No.: 13/304,085

(22) Filed: Nov. 23, 2011

(65) Prior Publication Data

US 2013/0126818 A1 May 23, 2013

(51) Int. Cl.
*H01L 47/00* (2006.01)
(52) U.S. Cl.
USPC ...................................... 257/4; 257/E45.003
(58) Field of Classification Search
USPC ............................ 257/2, 4, E45.003, E21.521
See application file for complete search history.

(56) References Cited

U.S. PATENT DOCUMENTS

| | | | |
|---|---|---|---|
| 2002/0000593 A1* | 1/2002 | Nishiyama et al. | 257/296 |
| 2007/0215977 A1* | 9/2007 | Lee et al. | 257/536 |
| 2008/0090337 A1* | 4/2008 | Williams | 438/133 |
| 2009/0302365 A1* | 12/2009 | Bhattacharyya | 257/298 |
| 2010/0308298 A1* | 12/2010 | Ninomiya et al. | 257/5 |

OTHER PUBLICATIONS

Cheng, et al., "High Performance Ultra-Low Energy RRAM with Good Retention and Endurance", (IEDM) Tech. Dig. (IEEE), (Dec. 2010) pp. 448-451, San Francisco, CA.
Cheng, et al., "Long Endurance Nano-Crystal TiO2 Resistive Memory Using TaON Buffer Layer", IEEE Electron Device Lett., (2011) (accepted).

* cited by examiner

*Primary Examiner* — Selim Ahmed
(74) *Attorney, Agent, or Firm* — Muncy, Geissler, Olds & Lowe, P.C.

(57) ABSTRACT

Resistive random access memory (RRAM) using stacked dielectrics and a method for manufacturing the same are disclosed, where a setting power of only 4 µW, an ultra-low reset power of 2 nW, good switching uniformity and excellent cycling endurance up to $5\times10^9$ cycles were achieved simultaneously. Such record high performances were reached in a Ni/GeO$_x$/nano-crystal-TiO$_2$/TaON/TaN RRAM device, where the excellent endurance is 4~6 orders of magnitude larger than existing Flash memory. The very long endurance and low switching energy RRAM is not only satisfactory for portable SSD in a computer, but may also create new applications such as being used for a Data Center to replace high power consumption hard discs.

5 Claims, 5 Drawing Sheets

RESISTIVE RANDOM ACCESS MEMORY (RRAM) USING STACKED DIELECTRICS AND METHOD FOR MANUFACTURING THE SAME

BACKGROUND OF THE INVENTION

1. Field of the Invention

The present invention relates to a resistive random access memory (RRAM) and method for manufacturing the same and, in particular, to a PRAM with a metal-insulator-metal (MIM) structure, using stacked dielectrics of semiconductor-oxide/nano-crystal (nc) metal-oxide/metal-oxynitride, and different work-function top and bottom electrodes. The RRAM device is implemented in stacked dielectrics of $GeO_x$/nc-$TiO_2$/TaON with low cost top (Ni) and bottom (TaN) electrodes. This RRAM device has special merits of ultra-low sub-100 fJ switching energy, tight distributions of set/reset currents and extremely long endurance of $5\times10^9$ cycles simultaneously.

2. Description of the Prior Art

According to International Technology Roadmap for Semiconductors (ITRS) at www.itrs.net, Flash Non-Volatile Memory (NVM) will continue to scale down into sub-20 nm, by replacing the current poly-Si Floating-Gate (FG) with SiN Charge Trapping (CT) structure. However, the degraded endurance from $10^5$ to $10^4$ program/erase cycles is a fundamental physics limitation due to the smaller amount of charges stored in the sub-20 nm cell size. Such degraded endurance is unsuitable for high-end products such as solid-state drive (SSD), and therefore new NVM devices should be developed. To address this issue, non-charge-based resistive random access memory (RRAM) has attracted much attention, and the simple cross-point structure is more suitable for embedded NVM applications and low-cost three-dimensional (3D) integration. However, high set/reset currents, high forming power, wide set/reset margin and poor endurance are difficult challenges for RRAM.

SUMMARY OF THE INVENTION

The present invention reveals a novel high endurance and ultra-low switching power RRAM device, with a setting power of only 4 µW, an ultra-low reset power of 2 nW, a large resistance window>50×, good switching uniformity, and excellent cycling endurance up to $5\times10^9$ cycles, all achieved simultaneously. Such record high performances were reached in a Ni/$GeO_x$/nc-$TiO_2$/TaON/TaN RRAM device, where the excellent endurance is 4~6 orders of magnitude larger than existing Flash memory. The low switching energy and very long endurance RRAM is not only satisfactory for portable SSD in a computer, but may also create new applications such as being used for a Data Center to replace high power consumption hard discs.

BRIEF DESCRIPTION OF THE DRAWINGS

FIG. 4 (b) illustrates set/reset endurance characteristics at a 10 ns or 100 ns switching pulse of Ni/$GeO_x$/nc-$TiO_2$/TaON/TaN RRAM.

DETAILED DESCRIPTION OF THE PREFERRED EMBODIMENTS

The RRAM devices were integrated into VLSI backend for embedded memory application. First, a 200-nm-thick backend $SiO_2$ layer was formed on the Si substrates. The 100 nm TaN layer was deposited by sputtering. After patterning the bottom TaN electrode, the 24-nm-thick TaON film was deposited and followed by oxygen annealing. Then the 26-nm-thick $TiO_2$ film was deposited on TaGN/TaN, where the crystallinity of $TiO_2$ was measured by transmission electron microscopy (TEM) using fast Fourier transition (FFT) technique. An amorphous-$TiO_2$ control sample was also fabricated for performance comparison. After that, a 6-nm-thick $GeO_x$ layer was covered to form the stacked dielectrics of $GeO_x$/$TiO_2$/TaON. Finally, a 50-nm-thick Ni layer was deposited and patterned to form the top electrode by a metal mask.

Figure 1A:
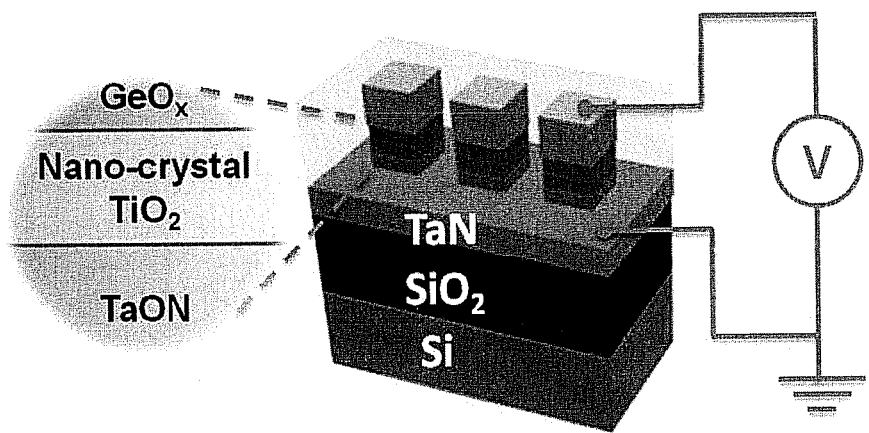
FIG. 1 (a) is a schematic illustration of the RRAM and FIG. 1 (b) illustrates a measured swept I-V curve of Ni/$GeO_x$/nc-$TiO_2$/TaON/TaN RRAM devices.
Figure 1B:
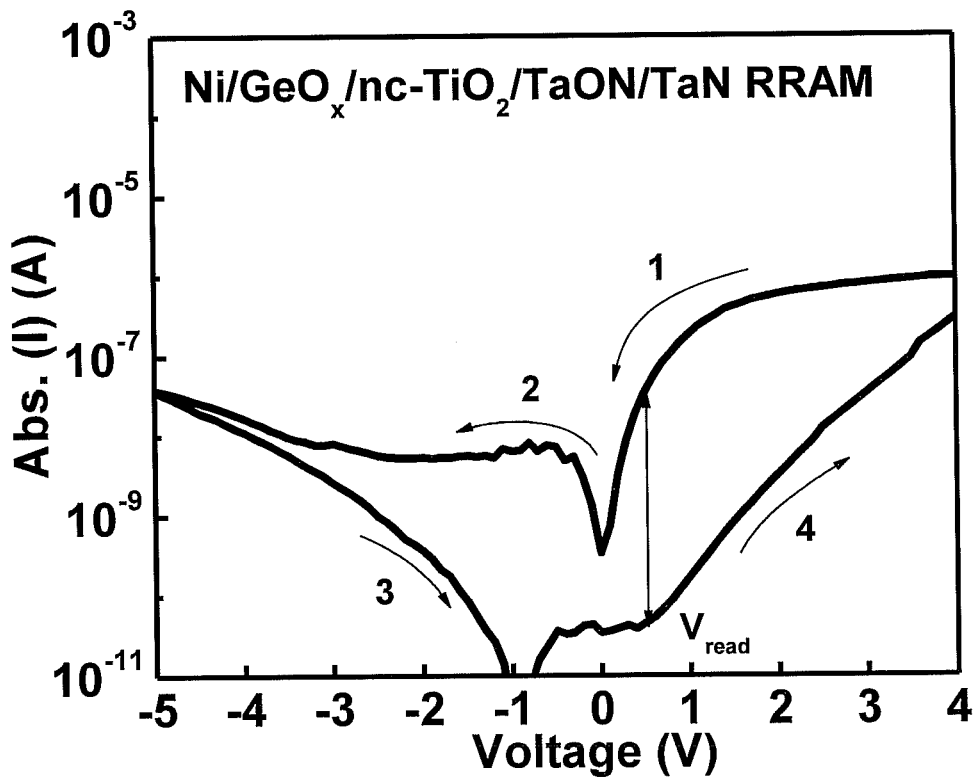
Figure 2A:
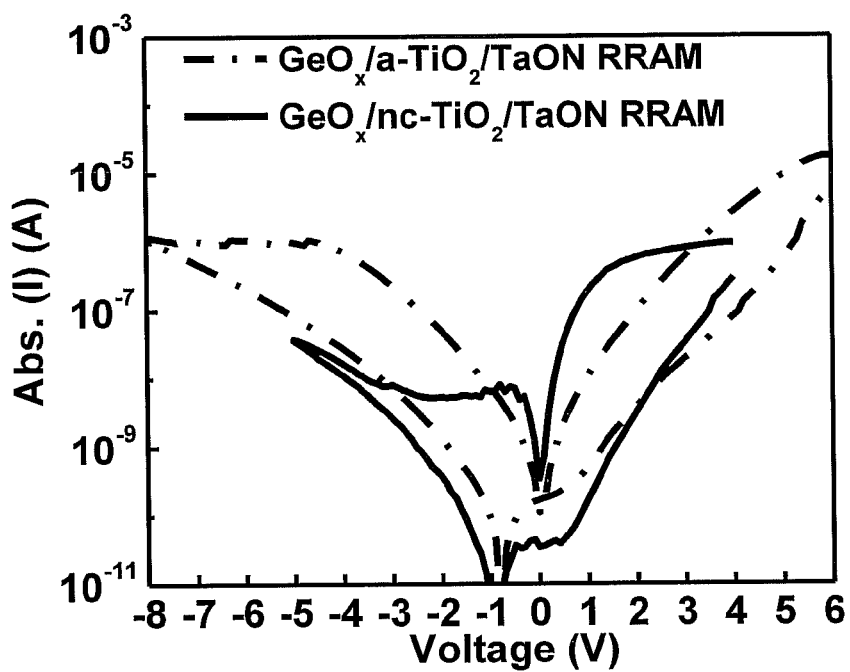
FIG. 2 (a) illustrates swept I-V curves, FIG. 2 (b) illustrates resistive switching behaviors under 60 ms set/reset stress cycles, and FIG. 2(c) are cross-sectional TEM images of Ni/$GeO_x$/$TiO_2$/TaON/TaN RRAM with nc-$TiO_2$ or control amorphous-$TiO_2$ layer.
Figure 2B:
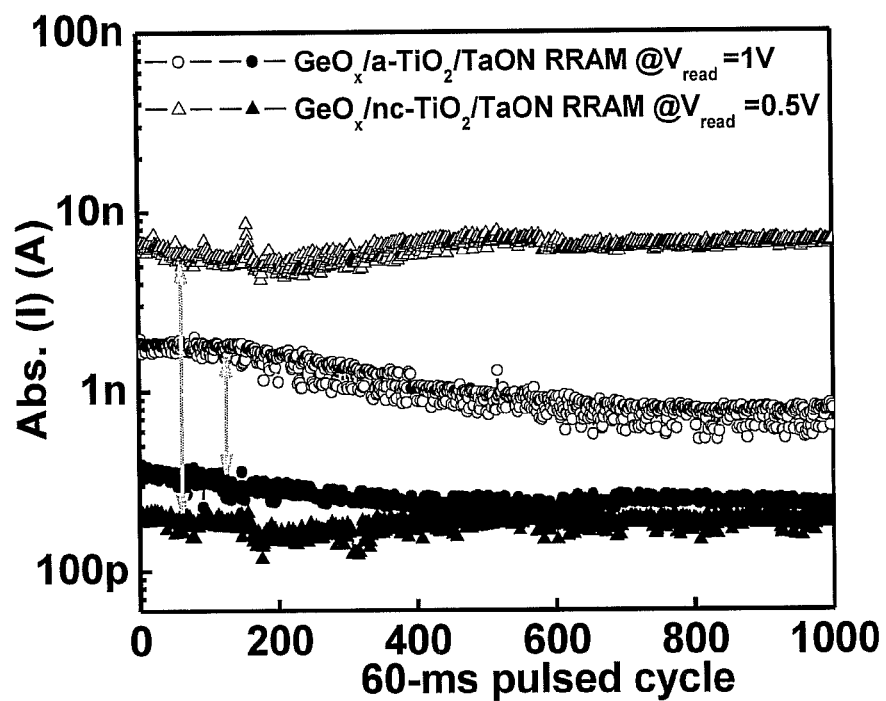
Figure 2C:
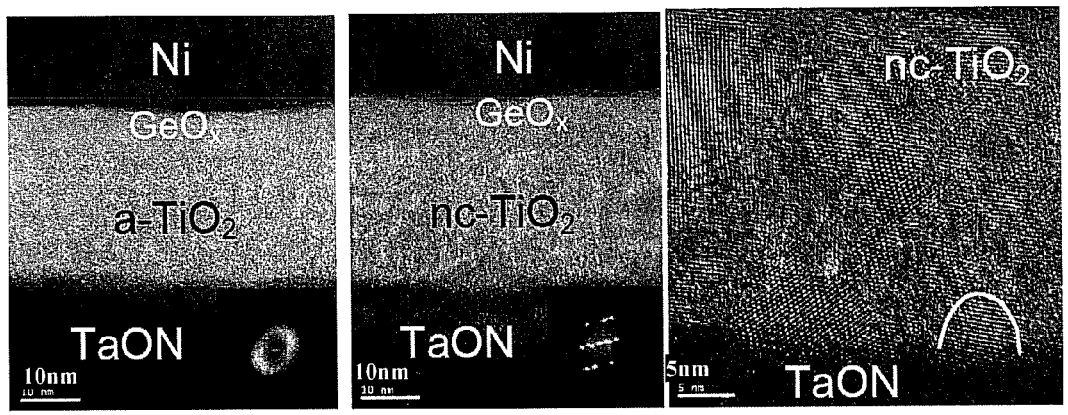
Figure 3A:
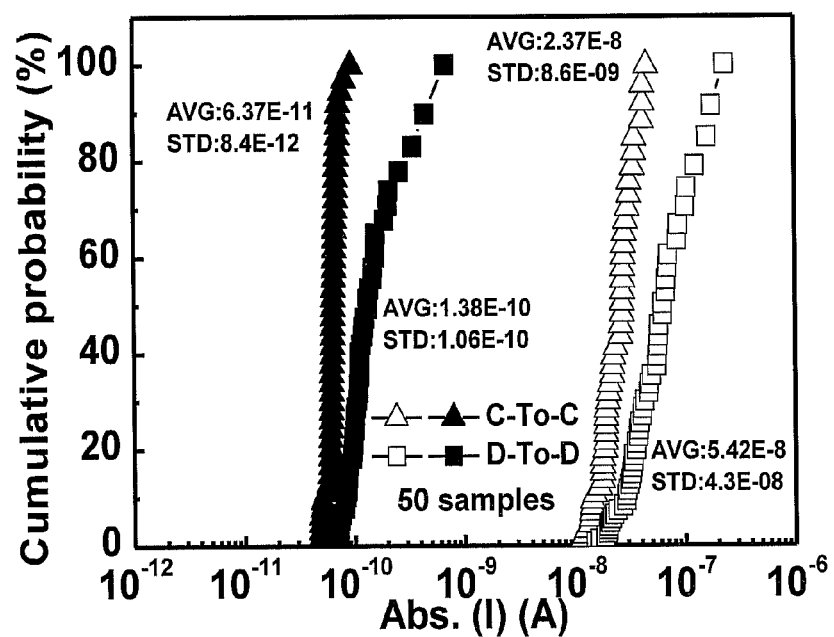
FIG. 3 (a) illustrates current distributions and FIG. 3 (b) illustrates disturbance characteristics of Ni/$GeO_x$/nc-$TiO_2$/TaON/TaN RRAM.
Figure 3:
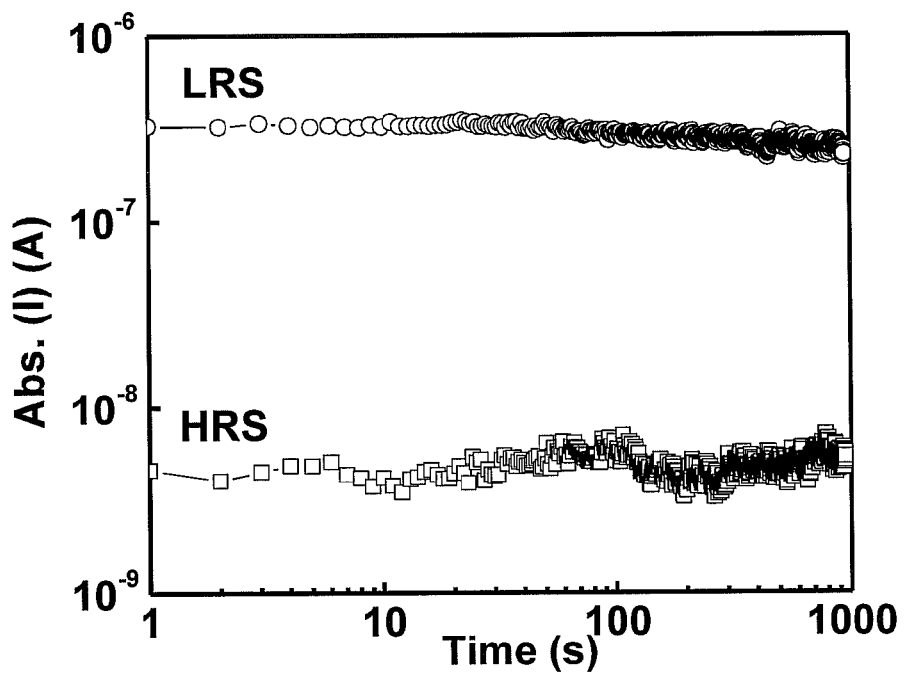

FIG. 1(a) is a schematic illustration of the Ni/$GeO_x$/nc-$TiO_2$/TaON/TaN RRAM. FIG. 1(b) is a measured swept I-V curve of Ni/$GeO_x$/nc-$TiO_2$/TaON/TaN RRAM devices. Good resistive switching characteristics were measured, where a large resistance window of >100X at 0.5 V was obtained. In addition to the free-forming and self-compliant operation, the RRAM of the present invention can be set to a low resistance state (LRS) at an ultra-low power of 4 µW (1 µA at 4 V) and reset to a high resistance state (HRS) at a very low power of only 2 nW (−0.4 nA at −5 V). The nc-$TiO_2$ (nano-crystal $TiO_2$) plays an important role to reach low switching power in RRAM. FIGS. 2(a), 2(b) and 2(c) show swept I-V curves, resistive switching behaviors under 60 ms set/reset stress cycles, and cross-sectional TEM images of Ni/$GeO_x$/$TiO_2$/TaON/TaN RRAM, respectively, where different nc-$TiO_2$ or amorphous-$TiO_2$ in RRAM devices were used for comparison. Although a similar I-V switching behavior can be observed, the control device with amorphous-$TiO_2$ needs larger set and reset voltages of 6 V and −8 V, respectively. Besides, significantly higher switching currents for set (18 µA) and reset (1.2 µA) were found in the RRAM device with amorphous-$TiO_2$ than those with nc-$TiO_2$. The distributions of resistance states are an important concern for RRAM. FIG. 3(a) shows the current distributions of Ni/$GeO_x$/nc-$TiO_2$/TaON/TaN RRAM, where very tight current distributions for both LRS and HRS were reached. The excellent switching uniformity (both cycle-to-cycle and device-to-device) is linked to the low power operation with low set/reset currents and self-compliance, which is significantly better than a conventional RRAM using metallic filament conduction. The switching speed is a key factor for RRAM. To address the issue of whether low switching power may cause read disturbances in RRAM, the RRAM devices were subjected to constant voltage stress (CVS) at a different read bias for 1000 sec. As shown in FIG. 3(b) (disturbance characteristics of Ni/$GeO_x$/nc-$TiO_2$/TaON/TaN RRAM), stable LRS and HRS values can be maintained at a 0.5 V read voltage for 1000 sec, which is equivalent to $10^{10}$ reading cycles at a 100 ns pulse. The negligible read disturbance for LRS is because the read voltage is 8 times lower than the set voltage, while the voltage polarity for reset is different from the read voltage.

Figure 4A:
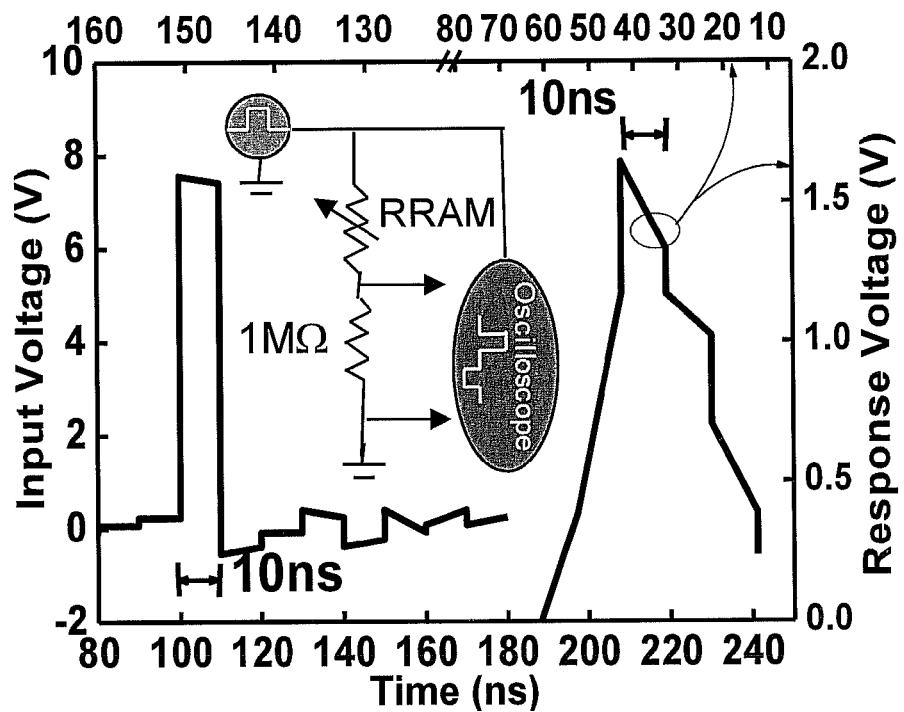
FIG. 4 (a) illustrates an extracted voltage waveform of a fixed 1 Mega-ohm resistor connected to the RRAM device at a fast speed of 10 ns.
Figure 4B:
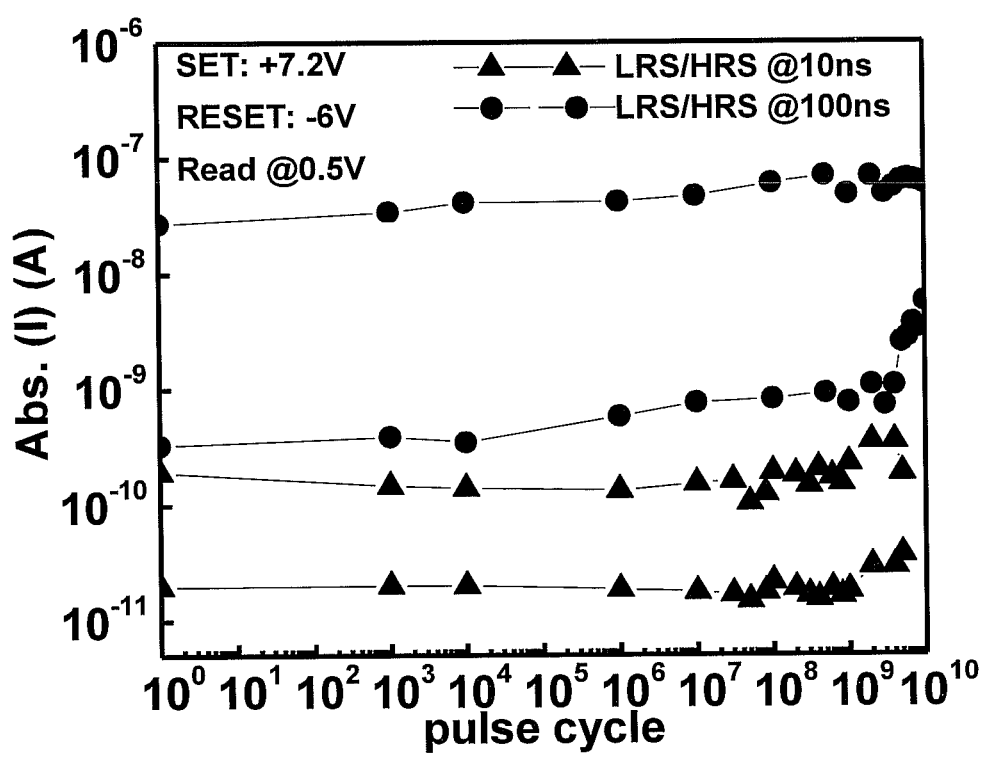

FIG. 4(a) shows the switching response of an input voltage applied on a fixed 1 M-ohm external resistor connected to the RRAM. Fast switching response is measured at the applied over-stressed set pulse of 10 ns, where the distorted output waveform is due to parasitic capacitance and bonding wire. Such fast switching capability is only measured in Ni/GeO$_x$/TiO$_2$/TaON/TaN RRAM with nc-TiO$_2$ but not amorphous-TiO$_2$ devices. Endurance is also a severe limiting factor for conventional metallic filament RRAM. FIG. 4(b) shows the measured endurance characteristics under an over-stressed set pulse of 7.2 V and reset pulse of −6 V for 10 and 100 ns. Stable switching with a nearly constant HRS/LRS ratio is obtained for extremely long $5 \times 10^9$ set/reset cycles, with ultra-low sub-100 or sub-10 fJ switching energy. Such excellent endurance is ascribed to the fast switching speed, low switching power, easy hopping via grain boundaries, and higher-κ nc-TiO$_2$ (κ.>40) to lower stress electrical field. FIG. 4(c) shows the measured cycling characteristics as a function of over-stressed voltage with a longer 60-ms pulse. The measured $5 \times 10^4$ cycles guarantees more than $10^{10}$ cycles using a faster 100 ns pulse, which is consistent with measured data in FIG. 4(b).

According the experiment data above, the Ni/GeO$_x$/nc-TiO$_2$/TaON/TaN RRAM device of the present invention has only a 4 μW setting power, an ultra-low reset power of 2 nW, a large resistance window of >50X, good switching uniformity, and an excellent cycling endurance up to $5 \times 10^9$ cycles. The excellent endurance is 4~6 orders of magnitude larger than existing Flash memory. The very long endurance and ultra-low switching energy RRAM is not only sufficient for portable SSD in a computer, but may also create new applications such as being used for a Data Center to replace high power consumption hard discs.

The preferred embodiment mentioned above is only for illustrative purposes, and any RRAM which is formed by Metal-Insulator-Metal (MIM) structure or based on the Metal-Insulator-Semiconductor (MIS) structure, should be regarded as the same as the embodiment disclosed. Also, the dielectric materials can be selected from the semiconductor oxide of GeO$_2$, SiO$_2$, metal-oxide of SnO$_2$, Al$_2$O$_3$, HfO$_2$, ZrO$_2$, TiO$_2$, CeO$_2$, NiO, Ta$_2$O$_5$, ZnO, WO, CuO$_2$, SrTiO$_3$, and related oxynitride thereof. The material of the electrodes can be selected from metal, metal-nitride, or conductive metal-oxide of Ta, TaN, Ti, TiN, W, WN, MoN, Al, Ni, Ir, Pt, Ru, Ag, Cu, Au, and ITO (Indium Tin Oxide). The nano-crystal (nc) metal oxide or metal-oxynitride such as TiO$_2$, TiON, Ta$_2$O$_5$, TaON, etc can be formed by any one of furnace annealing, RTA, laser annealing, and in-situ annealing in PVD/CVD systems.

What is claimed is:

1. A resistive random access memory (RRAM) using stacked dielectrics, wherein the RRAM is formed by the stacked dielectrics composed of semiconductor-oxide, nano-crystal (nc) metal-oxide, and metal-oxynitride, wherein the nc metal-oxide is stacked between the semiconductor-oxide and the metal-oxynitride,
   wherein at least the nc metal-oxide is formed of a different material than the semiconductor-oxide, and
   wherein the nc metal oxide is formed of TiO$_2$, the semiconductor-oxide is formed of GeO$_x$, and the metal-oxynitride is formed of TaON.

2. The resistive random access memory (RRAM) using stacked dielectrics as claimed in claim 1, wherein the RRAM further includes top and bottom electrodes having different work functions.

3. The RRAM using stacked dielectrics as claimed in claim 2, wherein the material of the electrodes is selected from metal, metal-nitride, and conductive metal-oxide of Ta, TaN, Ti, TiN, W, WN, MoN, Al, Ni, Ir, Pt, Ru, Ag, Cu, Au, and Indium Tin Oxide (ITO).

4. A RRAM using stacked dielectrics, wherein the stacked dielectrics is formed by Metal-Insulator-Metal (MIM) structure or based on the Metal-Insulator-Semiconductor (MIS) structure, and composed of nano-crystal (nc) metal-oxide stacked between semiconductor-oxide and metal-oxynitride,
   wherein at least the nc metal-oxide is formed of a different material than the semiconductor-oxide, and
   wherein the nc metal oxide is formed of TiO$_2$, the semiconductor-oxide is formed of GeO$_x$, and the metal-oxynitride is formed of TaON.

5. A method for manufacturing RRAM with stacked dielectrics, wherein nano-crystal (nc) metal oxide which is selected from TiO$_2$, Ta$_2$O$_5$, HfO$_2$, ZrO$_2$, ZnO, and SrTiO$_3$ is formed by at least one of furnace annealing, RTA, laser annealing, and in-situ annealing in PVD/CVD systems, and wherein the RRAM is formed so that the nc metal oxide is stacked between semiconductor-oxide and metal-oxynitride,
   wherein at least the nc metal-oxide is formed of a different material than the semiconductor-oxide, and
   wherein the nc metal oxide is formed of TiO$_2$, the semiconductor-oxide is formed of GeO$_x$, and the metal-oxynitride is formed of TaON.

* * * * *